United States Patent
Bao et al.

(10) Patent No.: US 12,191,433 B2
(45) Date of Patent: Jan. 7, 2025

(54) DISPLAY MODULE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wenqiang Bao, Beijing (CN); Zhihui Wang, Beijing (CN)

(73) Assignees: Chendu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 524 days.

(21) Appl. No.: 17/485,150

(22) Filed: Sep. 24, 2021

(65) Prior Publication Data
US 2022/0246811 A1   Aug. 4, 2022

(30) Foreign Application Priority Data
Feb. 3, 2021 (CN) .............................. 202110149421

(51) Int. Cl.
*H01L 33/62* (2010.01)
*H01L 23/14* (2006.01)
*H01L 33/00* (2010.01)
*H05K 1/11* (2006.01)
*H10K 59/10* (2023.01)

(52) U.S. Cl.
CPC .............. *H01L 33/62* (2013.01); *H01L 23/14* (2013.01); *H01L 33/005* (2013.01); *H05K 1/118* (2013.01); *H01L 2933/0033* (2013.01); *H10K 59/10* (2023.02)

(58) Field of Classification Search
CPC ....... H01L 33/62; H01L 23/14; H01L 33/005; H01L 2933/0033; H05K 1/118; H05K 3/323; H05K 1/189; H05K 1/0281; H05K 9/0073; H05K 1/14; H10K 59/10
See application file for complete search history.

(56) References Cited

U.S. PATENT DOCUMENTS

| | | | | |
|---|---|---|---|---|
| 6,388,339 B1* | 5/2002 | Yamamoto | ............ | H01L 21/563 |
| | | | | 257/E21.503 |
| 2003/0218190 A1* | 11/2003 | Hashimoto | ............ | H05K 3/361 |
| | | | | 257/200 |
| 2009/0141438 A1* | 6/2009 | Aita | ........................ | H05K 3/323 |
| | | | | 174/254 |
| 2017/0076663 A1* | 3/2017 | Nishimura | ........... | G09G 3/3266 |
| 2018/0007793 A1* | 1/2018 | Zhang | .................... | H05K 1/028 |
| 2018/0183003 A1* | 6/2018 | Han | .................... | H01L 27/1255 |
| 2019/0318689 A1* | 10/2019 | Kim | .................... | H05K 1/0281 |
| 2020/0335429 A1* | 10/2020 | Okaue | .................... | H01L 24/08 |

(Continued)

*Primary Examiner* — Jarrett J Stark
(74) *Attorney, Agent, or Firm* — Calfee, Halter & Griswold LLP

(57) ABSTRACT

The present disclosure provides a display module, a manufacturing method thereof, and a display device. The display module includes: a display panel including a substrate; a chip on film connected to the display panel; a circuit board connected to the chip on film; and a first film layer attached to surfaces of the display panel and the circuit board facing away from the substrate and covering at least the chip on film and the circuit board.

19 Claims, 5 Drawing Sheets

(56) References Cited

U.S. PATENT DOCUMENTS

| | | | |
|---|---|---|---|
| 2021/0050534 A1* | 2/2021 | Yang | H10K 71/00 |
| 2021/0159221 A1* | 5/2021 | Li | H01L 25/18 |
| 2021/0167328 A1* | 6/2021 | Kim | H05K 3/361 |
| 2021/0174111 A1* | 6/2021 | Im | G06V 40/1306 |
| 2021/0255669 A1* | 8/2021 | Ha | G09F 9/301 |
| 2021/0307174 A1* | 9/2021 | Jang | H05K 1/111 |
| 2021/0325707 A1* | 10/2021 | Nie | G02F 1/13452 |
| 2022/0046785 A1* | 2/2022 | Kang | H05K 1/0206 |
| 2022/0057337 A1* | 2/2022 | Park | G01N 21/956 |
| 2022/0069249 A1* | 3/2022 | Kim | H10K 59/131 |
| 2022/0123120 A1* | 4/2022 | Lee | H01L 29/42376 |
| 2023/0411577 A1* | 12/2023 | Yoon | H01L 27/1214 |
| 2024/0065038 A1* | 2/2024 | Yamazaki | H10K 50/00 |

* cited by examiner

DISPLAY MODULE, MANUFACTURING METHOD THEREOF, AND DISPLAY DEVICE

RELATED APPLICATION

This application claims the priority of the Chinese Patent Application No. 202110149421.0 filed on Feb. 3, 2021, the entire disclosure of which is incorporated herein by reference.

TECHNICAL FIELD

The present disclosure relates to the field of display technology, and in particular, to a display module, a manufacturing method thereof, and a display device comprising the display module.

BACKGROUND

With the continuous development of display technology, display devices are applied to more and more fields. The display device usually comprises a display panel, a printed circuit board, and an electrical connection component that connects the display panel and the printed circuit board. The electrical connection component comprises an integrated circuit (IC) chip. According to the way the IC chip is mounted on the display panel, the electrical connection component may generally be divided into several types such as CoG (Chip on Glass), CoP (Chip on Plastic), and CoF (Chip on Flex, or, Chip on Film). COG refers to attaching the IC chip to a glass substrate of the display panel, COP refers to attaching the IC chip to a plastic substrate of the display panel, and COF refers to attaching the IC chip to a flexible circuit board, also known as a chip on film. When a chip on film is used in a display device, an externally applied signal is transmitted to the IC chip of the chip on film through the printed circuit board, and the IC chip processes the signal and sends it to individual pixels of the display panel, so that the display panel can display a corresponding image.

SUMMARY

According to an aspect of the present disclosure, there is provided a display module, comprising: a display panel comprising a substrate; a chip on film connected to the display panel; a circuit board connected to the chip on film; and a first film layer attached to surfaces of the display panel and the circuit board facing away from the substrate and covering at least the chip on film and the circuit board.

In some embodiments, the circuit board comprises an integrated circuit chip and a timing controller, the first film layer comprises a plurality of openings, and the plurality of openings at least expose the integrated circuit chip and the timing controller.

In some embodiments, the first film layer comprises a first adhesive area, the first adhesive area comprises a first part and a second part extending in a first direction, and an adhesion of the first part and the second part of the first adhesive area is 3-10 gf/inch.

In some embodiments, the first film layer further comprises a non-adhesive area, the non-adhesive area is between the first part and the second part of the first adhesive area, and the non-adhesive area and an orthographic projection of the chip on film on the first film layer at least partially overlap.

In some embodiments, the non-adhesive area is coated with ink.

In some embodiments, four sides of the first film layer respectively extend beyond the chip on film and the circuit board, and the first film layer covers a part of the substrate of the display panel.

In some embodiments, a thickness of the first film layer in a direction perpendicular to the substrate is less than or equal to 0.1 mm.

In some embodiments, the first film layer comprises a connecting strip adhered to the display module.

In some embodiments, the display module further comprises a second film layer. The second film layer is attached to the substrate of the display panel, and the second film layer covers surfaces of the display panel, the chip on film, and the circuit board facing away from the first film layer.

In some embodiments, two opposite sides of the second film layer respectively extend beyond the chip on film and the circuit board, the two opposite sides of the second film layer extend in a second direction intersecting with the first direction. The first film layer further comprises a second adhesive area extending in the second direction and on both sides of the first adhesive area, an adhesion of the second adhesive area is greater than the adhesion of the first adhesive area, the second adhesive area extends beyond the chip on film and the circuit board, and the second adhesive area is adhered to the two opposite sides of the second film layer.

In some embodiments, the adhesion of the second adhesive area is 30 gf/inch.

In some embodiments, the second film layer comprises at least two sub-film layers separated from each other, and the at least two sub-film layers are both attached to the substrate of the display panel.

In some embodiments, a width of the second film layer in the first direction gradually increases in a direction from the display panel to the circuit board.

In some embodiments, four sides of the second film layer respectively extend beyond the display panel, the chip on film, and the circuit board by at least 3-5 mm.

In some embodiments, a thickness of the second film layer in a direction perpendicular to the substrate is 0.3-0.5 mm.

In some embodiments, an adhesion of the second film layer is 3-10 gf/inch.

In some embodiments, both sides of the first film layer extending in a second direction intersecting with the first direction comprise first lugs, and both sides of the second film layer extending in the second direction comprise second lugs.

According to another aspect of the present disclosure, there is provided a display device, which comprises the display module described in any of the foregoing embodiments.

According to still another aspect of the present disclosure, there is provided a method for manufacturing a display module, comprising the following steps: providing a display panel, the display panel comprising a substrate; connecting a chip on film to the display panel; connecting a circuit board to the chip on film; attaching a first film layer to surfaces of the display panel and the circuit board facing away from the substrate, so that the first film layer covers at least the chip on film and the circuit board; temporarily removing the first film layer to expose the chip on film and the circuit board during an operation of the chip on film and the circuit board; and resetting the first film layer after completing the operation of the chip on film and the circuit board.

In some embodiments, before the step of attaching a first film layer to surfaces of the display panel and the circuit board facing away from the substrate, the method further comprises: attaching a second film layer to the substrate of the display panel, so that the second film layer covers surfaces of is the display panel, the chip on film, and the circuit board facing away from the first film layer.

BRIEF DESCRIPTION OF THE DRAWINGS

In order to more clearly describe the technical solutions in the embodiments of the present disclosure, the drawings needed in the embodiments will be briefly introduced in the following. Obviously, the drawings described in the following are only some embodiments of the present disclosure. For those of ordinary skill in the art, other drawings can also be obtained based on these drawings without creative work.

DETAILED DESCRIPTION OF THE DISCLOSURE

Figure 1:
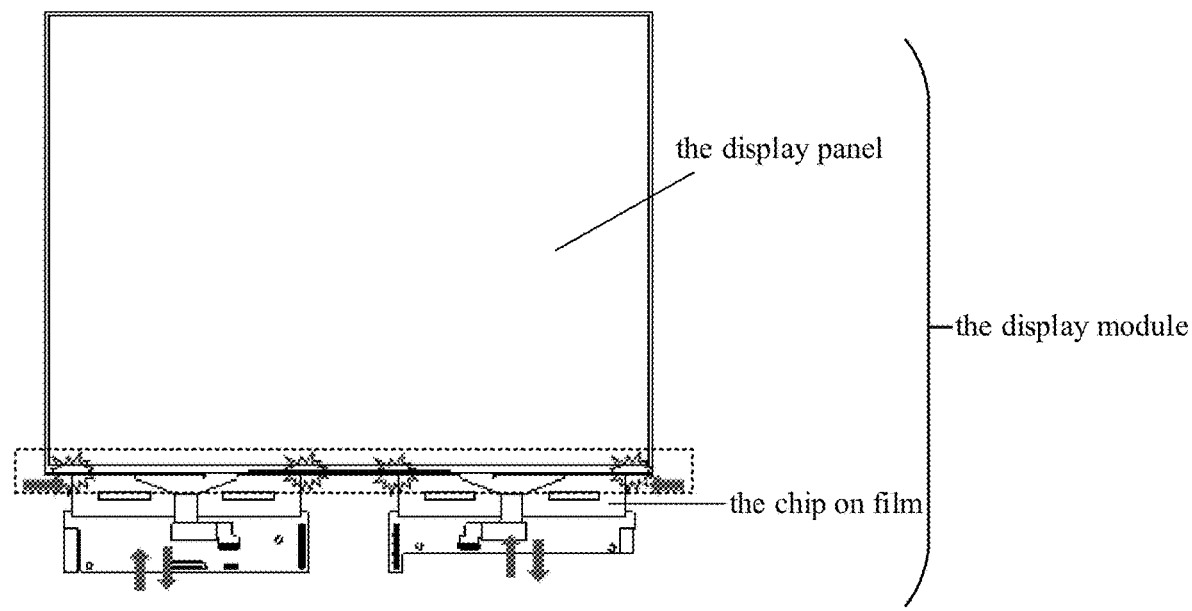
FIG. 1 illustrates a schematic diagram of the peeling position and the force direction of a chip on film of a display module in the related art.

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure. It should be noted that, for ease of description, only components related to the technical solutions of the embodiments of the present disclosure are shown in the drawings, and other components are omitted. In addition, it should be noted that the embodiments in the present disclosure and the features in the embodiments can be combined with each other without conflict.

A chip on film is usually formed by a chip soft film packaging technology, also known as a flexible packaging substrate, which directly mounts the driving chip on the soft film carrier tape. For a display module containing the chip on film, it is usually composed of a driver chip, a display panel, a printed circuit board, other passive components (such as resistors, capacitors, etc.), a flexible circuit board, and an anisotropic conductive film (ACF). One end of the flexible circuit board is connected with the display panel, and the other end is connected with the printed circuit board. Then, the chip bumps on the driving chip and the inner pins on the flexible circuit board are bonded by thermocompression to achieve the installation purpose of high density, light weight, small volume, and free bending of the display module package.

Generally, a large-size display panel is provided with multiple chip on films on the side, one end of the chip on film is bonded with the display panel, and the other end away from the display panel is bonded with the printed circuit board assembly (that is, an entire manufacturing process of a SMT loading or DIP plug-in on a bare PCB, referred to as PCBA).

After the chip on film has been bonded with the PCBA, the display module needs to continue to circulate in the production line to perform operations such as attaching the heat dissipating film, connecting the patch cord, and lighting test to the chip on film and PCBA. However, during the production line circulation, packaging or transportation of display modules (especially large or medium-sized display modules such as notebook (NB), vehicle-mounted modules, etc.), and even during standard operations such as jig adsorption, the peeling of the chip on film often occurs, which makes the chip on film detach from the display panel and/or the PCBA and cannot achieve normal electrical connection.

The inventor(s) of the present application found that there are two main reasons that cause the peeling of the chip on film in the display module:

First, the distance between the chip on film and the edge of the display panel is relatively small, about 10 mm. When the operator picks up and places the display module, if the display panel is slightly tilted or has too large moving radian, the chip on film may collide with objects (such as trays, countertops, jigs, etc.), causing damage or peeling of the chip on film at the bonding position with the display panel and/or PCBA.

Second, one end of the chip on film is bonded with the display panel, and the other end is bonded with the PCBA. The chip on film is very easy to be pulled by the PCBA, which causes damage or peeling of the chip on film at the bonding position with the display panel and/or PCBA. FIG. 1 illustrates a schematic diagram of a structure of a display module in the related art, and the dotted frame in the figure illustrates that peeling of the chip on film occurs at the bonding position with the display panel under the external force.

Currently, for the problem of peeling of the chip on film, the only hope is that the operator adopts a jig to absorb the display module, and the display module is picked up by the standard operation and as flat as possible to avoid hitting the trays or foreign objects. However, this kind of personnel operation standard cannot solve the problem fundamentally, and the actual effect is not good. In the actual production process, the phenomenon of peeling of the chip on film still frequently occurs.

Figure 2:
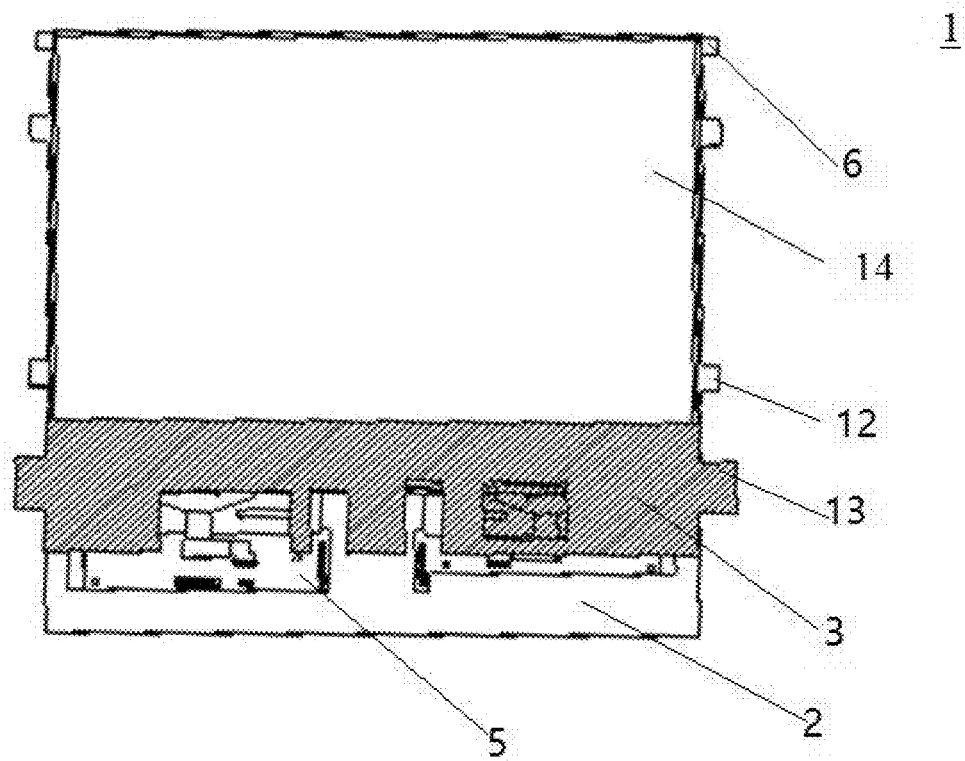
FIG. 2 illustrates a schematic diagram of a structure of a display module according to an embodiment of the present disclosure.

In view of this, an embodiment of the present disclosure provides a display module, and FIG. 2 illustrates a schematic structural diagram of the display module 1. As illustrated in FIG. 2, the display module 1 comprises: a display panel 14 comprising a substrate (not illustrated), which is located at the bottom of the display panel 14; a chip on film 4 (not illustrated in FIG. 2, please refer to FIG. 5) connected to the display panel 14; a circuit board 5 connected to the chip on film 4, the circuit board 5 may be, for example, a printed circuit board; and a first film layer 3, which is attached to the surfaces of the display panel 14 and the circuit board 5 facing away from the substrate (that is, the upper surfaces of the display panel 14 and the circuit board 5 in the figure) and covers at least the chip on film 4 and the circuit board 5.

One end of the first film layer 3 is attached to a side of the display panel 14 close to the chip on film 4, and the other end of the first film layer 3 is attached to a side of the circuit board 5 away from the chip on film 4. Therefore, the first film layer 3 is over the chip on film 4 and the circuit board 5 and covers the chip on film 4 and the circuit board 5, and therefore covers the bonding area of the chip on film 4 with the display panel 14, and the bonding area of the chip on film 4 with the circuit board 5. Through this arrangement, the first film layer 3 can better fix the chip on film 4 and the circuit board 5, and can better protect the bonding areas of the chip on film 4, thereby reducing or even avoiding the peeling of the chip on film 4 when pulled or scratched by foreign objects, improving the production yield of the display module 1, increasing production efficiency, and reducing production costs.

Figure 3:
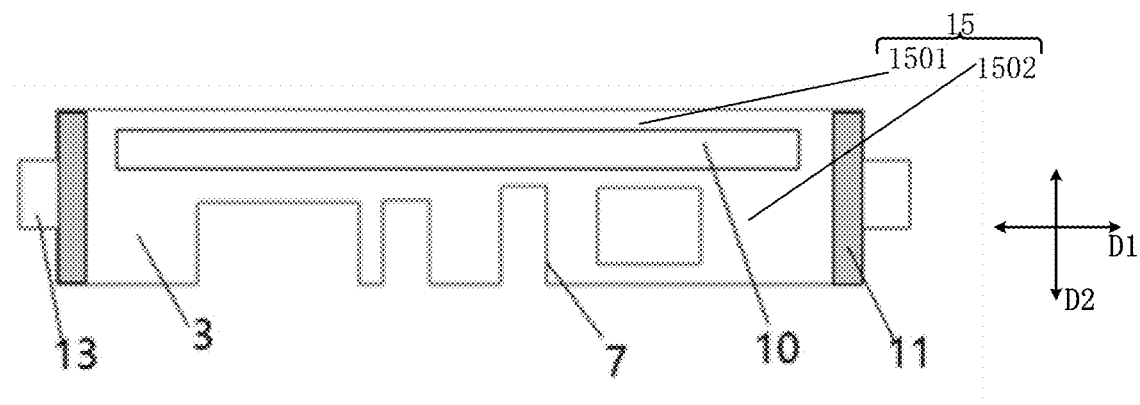
FIG. 3 illustrates a schematic diagram of a structure of a first film layer according to an embodiment of the present disclosure.

FIG. 3 illustrates a schematic diagram of the structure of the first film layer 3. Referring to FIGS. 2 and 3, in some embodiments, the first film layer 3 may comprise a plurality of openings 7. The circuit board 5 usually comprises electronic components such as a capacitor, a timing controller (T-CON), a power management integrated circuit (PMIC), and ELIC (any layer interconnection). The plurality of openings 7 of the first film layer 3 at least need to expose the integrated circuit chip and the timing controller of the circuit board 5. In an alternative embodiment, the plurality of openings 7 of the first film layer 3 expose electronic components of the circuit board 5 such as a capacitor, T-CON, PMIC, ELIC, etc. By providing the openings 7, it is possible to avoid scratching the circuit board 5 when the first film layer 3 is peeled off or attached.

As illustrated in FIG. 3, the first film layer 3 comprises a first adhesive area 15 which comprises a first part 1501 and a second part 1502 extending along a first direction D1. The adhesion of the first part 1501 and the second part 1502 of the first adhesive area 15 may be 3-10 gf/inch. Such adhesion can prevent damage to the display components (such as the display panel 14, the chip on film 4, the circuit board 5, etc.) when the first film layer 3 is peeled off. In addition, recycling can also be achieved.

The first film layer 3 also comprises a non-adhesive area 10, which is located between the first part 1501 and the second part 1502 of the first adhesive area 15, and the non-adhesive area 10 and an orthographic projection of the chip on film 4 on the first film layer 3 at least partially overlap. In other words, in a direction perpendicular to the first film layer 3, the non-adhesive area 10 corresponds to the chip on film 4. The term "non-adhesive area" means that the adhesion of the first film layer 3 at this area is zero, or has an extremely small adhesion that can be ignored. In some embodiments, the non-adhesive area 10 of the first film layer 3 is coated with ink, so that the adhesion of the non-adhesive area 10 is zero. The ink can be a colorless and transparent ink or a colored ink.

That is to say, the first film layer 3 is arranged in segments, and the upper and lower first part 1501 and the second part 1502 have adhesion respectively to adhere to the display panel 14 and the circuit board 5, the middle part is the non-adhesive area 10 without adhesion to avoid the chip on film 4. It should be noted that the boundary of the non-adhesive area 10 does not completely coincide with the boundary of the chip on film 4, and can be specifically adjusted according to the area of the electrical elements on the chip on film 4 during specific settings. By providing the non-adhesive area 10 without any adhesion corresponding to the chip on film 4, it is possible to avoid pulling the chip on film 4 during the process of tearing the first film layer 3, thereby further avoiding the peeling of the chip on film 4 caused by pulling. In an alternative embodiment, the non-adhesive area 10 can also be a low-adhesive area with very low adhesion. By reducing the adhesion of the first film layer 3 at the non-adhesive area 10, the pulling of the chip on film 4 during the tearing can be reduced.

The four sides of the first film layer 3 respectively extend beyond the chip on film 4 and the circuit board 5, and the first film layer 3 covers a part of the substrate of the display panel 14. As illustrated in FIG. 2, the left side of the first film layer 3 extends beyond the left edge contours of the chip on film 4 and the circuit board 5, the right side of the first film layer 3 extends beyond the right edge contours of the chip on film 4 and the circuit board 5, the upper side of the first film layer 3 extends beyond the upper edge contours of the chip on film 4 and the circuit board 5, and the lower side of the first film layer 3 extends beyond the lower edge contours of the chip on film 4 and the circuit board 5. The area of the first film layer 3 is larger than the occupied area of the chip on film 4 and the circuit board 5, so that it can cover the chip on film 4 and the circuit board 5 well, so as to achieve a good fixing effect and protection effect on the chip on film 4 and the circuit board 5, to prevent the chip on film 4 from peeling.

The thickness of the first film layer 3 in the direction perpendicular to the substrate can be any appropriate value, and the embodiment of the present disclosure does not specifically limit the thickness of the first film layer 3. In an example, the thickness of the first film layer 3 in the direction perpendicular to the substrate may be less than or equal to 0.1 mm.

The material of the first film layer 3 may be any suitable material, and the embodiment of the present disclosure does not specifically limit the material of the first film layer 3. In an example, the material of the first film layer 3 is polyethylene glycol terephthalate (PET). PET, for example, has higher hardness and better stiffness.

Figure 5:
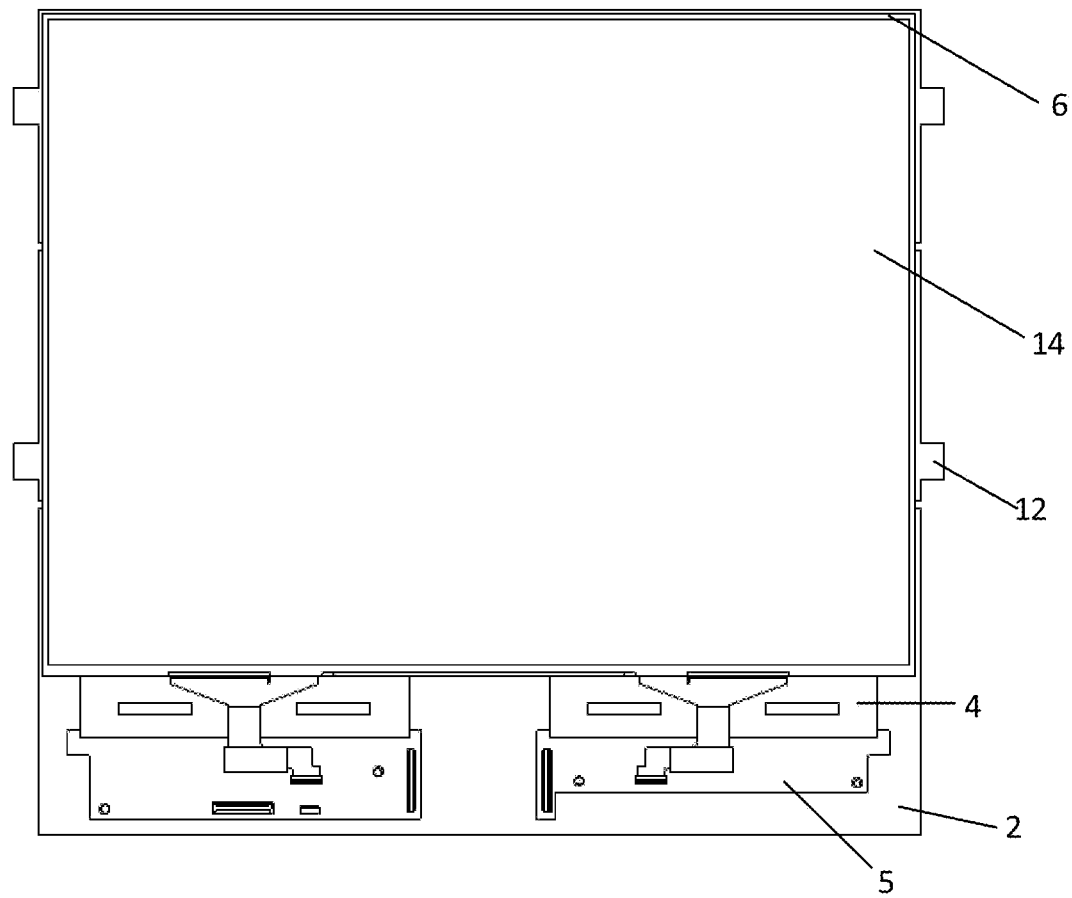
FIG. 5 illustrates a schematic diagram of a structure of a display module attached with a second film layer according to an embodiment of the present disclosure.

As illustrated in FIG. 2, the display module 1 may also comprise a second film layer 2. FIG. 5 illustrates a schematic diagram of the display module 1 omitting the first film layer 3 and only comprising the second film layer 2. Referring to FIGS. 2 and 5, the second film layer 2 is attached to the substrate of the display panel 14 and covers the surfaces of the display panel 14, the chip on film 4, and the circuit board 5 facing away from the first film layer 3. In other words, the second film layer 2 is attached to the lower surface of the display panel 14 and covers the lower surfaces of the display panel 14, the chip on film 4, and the circuit board 5. The four sides of the second film layer 2 respectively extend beyond the display panel 14, the chip on film 4 and the circuit board 5. As illustrated in the figure, the left side of the second film layer 2 extends beyond the left edge contours of the display panel 14, the chip on film 4, and the circuit board 5, the right side of the second film layer 2 extends beyond the right edge contours of the display panel 14, the chip on film 4, and the circuit board 5, the upper side of the second film layer 2 extends beyond the upper edge contour of the display panel 14, and the lower side of the second film layer 2 extends beyond the lower edge contour of the circuit board 5. In an example, the four sides of the second film layer 2 respectively extend beyond the display panel 14, the chip on film 4, and the circuit board 5 by at least 3-5 mm.

The second film layer 2 is attached to the substrate of the display panel 14 to provide a good support and buffer for the entire display module 1, which can effectively reduce the risk of stress mark on the display panel 14. In addition, for foldable products such as a notebook computer, the substrate of the display panel 14 is usually made of plastic material (required for folding), and the surface hardness of the substrate is usually about 1H. Such hardness can easily cause the substrate to be scratched during packaging and transportation. By attaching the second film layer 2 to the substrate of the display panel 14 and making the coverage area of the second film layer 2 larger than that of the substrate, the substrate of the display panel 14 can be well protected to avoid scratches during transportation. In addition, the second film layer 2 can also play a good role in fixing the display panel 14, the chip on film 4 and the circuit board 5, and prevent the chip on film 4 from peeling under the impact of external force.

As illustrated in FIGS. 2 and 3, the first film layer 3 further comprises the second adhesive areas 11 located on both sides of the first adhesive area 15 and extending along the second direction D2. The adhesion of the second adhesive areas 11 is greater than that of the first adhesive area 15. In an example, the adhesion of the second adhesive areas 11 is 30 gf/inch. The second adhesive areas 11 extend beyond the chip on film 4 and the circuit board 5. The adhesion of the second film layer 2 may be 3-10 gf/inch. The opposite left and right sides of the second film layer 2 respectively extend beyond the chip on film 4 and the circuit board 5, and the second adhesive areas 11 of the first film layer 3 are adhered to the opposite left and right sides of the second film layer 2, respectively. By making the second adhesive areas 11 of the first film layer 3 have higher adhesion, the adhesion and limiting effect of the first film layer 3 can be enhanced. By making the second adhesive areas 11 of the first film layer 3 adhere to the opposite left and right sides of the second film layer 2, the second adhesive areas 11 can be prevented from adhering to products (such as the chip on film 4 and the circuit board 5). That is to say, the second adhesive areas 11 of the first film layer 3 must avoid the chip on film 4 and the circuit board 5 to prevent the chip on film 4 and the circuit board 5 from being pulled when the second adhesive areas 11 with greater adhesion are torn, so as to prevent the chip on film 4 from peeling. The combination of the first film layer 3 and the second film layer 2 can better fix the chip on film 4 and the circuit board 5 of the display module 1, thereby avoiding the peeling of the chip on film 4 in the display module 1.

Figure 4A:
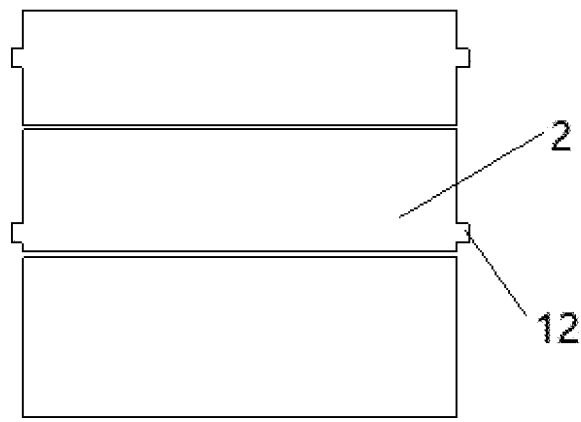
FIG. 4A illustrates a schematic diagram of a structure of a second film layer according to an embodiment of the present disclosure.

FIG. 4A illustrates a schematic diagram of a structure of the second film layer 2. As illustrated in the figure, the second film layer 2 comprises at least two sub-film layers separated from each other, and the at least two sub-film layers are both attached to the substrate of the display panel 14. FIG. 4A illustrates as an example that the second film layer 2 comprises three sub-film layers separated from each other. For large-size products such as 10 inches to 17 inches, considering the convenience of tearing the second film layer 2, this segmented solution can be adopted. Generally, the normal phone size of 6 inches is as the segmentation standard. For example, for a phone within 7 inches, a complete second film layer 2 can be used, that is, a complete and undivided film layer 2 is attached to the substrate of the display panel 14. For vehicle-mounted display screens of about 12 inches, the second film layer 2 can be divided into two sections, and each section is attached to the substrate of the display panel 14 to facilitate tearing. For notebook products from 17 inches to 24 inches, the second film layer 2 can be divided into three sections, and each section is attached to the substrate of the display panel 14 to facilitate tearing. According to the size of the display panel 14, in a direction from the upper edge 6 of the display panel 14 to the circuit board 5, the second film layer 2 can be divided into several sections and attached to the bottom substrate of the display panel 14.

Figure 4B:
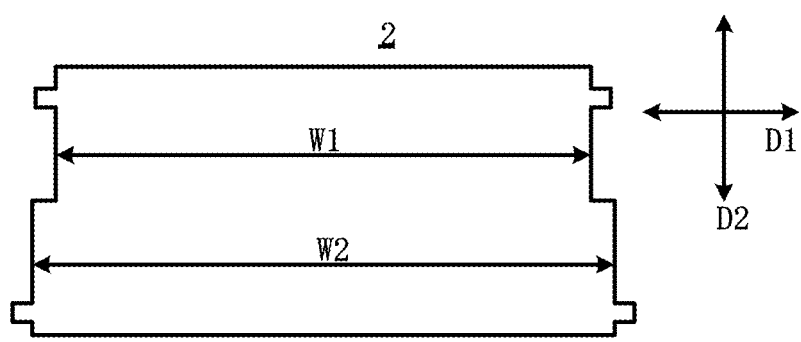
FIG. 4B illustrates a schematic diagram of another structure of a second film layer according to an embodiment of the present disclosure.

FIG. 4B illustrates another schematic diagram of the structure of the second film layer 2. As illustrated in the figure, in a direction from the display panel 14 to the circuit board 5, the width of the second film layer 2 along the first direction D1 gradually increases. For example, the width of a part of the second film layer 2 close to the display panel 14 is W1, and the width of another part of the second film layer 2 close to the circuit board 5 is W2, W1<W2.

Figure 4C:
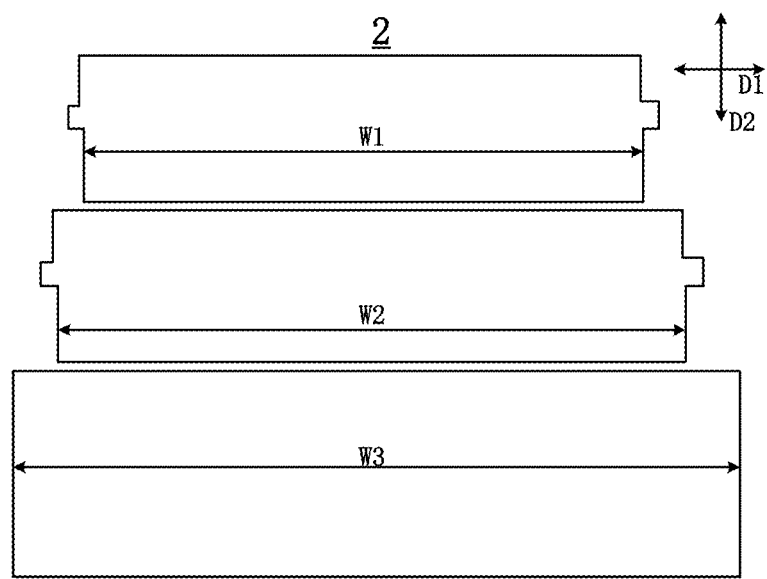
FIG. 4C illustrates a schematic diagram of still another structure of a second film layer according to an embodiment of the present disclosure.

FIG. 4C illustrates a schematic diagram of another structure of the second film layer 2. As illustrated in the figure, in some embodiments, the second film layer 2 may adopt a combination of a segmented type and a tapered type. For example, the second film layer 2 can be divided into three sections, in a direction from the upper edge 6 of the display panel 14 to the circuit board 5, the three sections are respectively the first section, the second section, and the third section. In applications, each section has even width along the first direction D1, but the widths of individual sections are as follows: the width W1 of the first section<the width W2 of the second section<the width W3 of the third section. Of course, it can also be set that the width of each section gradually increases along the direction from the display panel 14 to the circuit board 5, and the widths of the sections also gradually increase along this direction. For example, the width of the first section gradually increases along the direction from the display panel 14 to the circuit board 5, the width of the second section gradually increases along the direction from the display panel 14 to the circuit board 5, the width of the third section gradually increases along the direction from the display panel 14 to the circuit board 5, and the widest width of the first section<the widest width of the second section<the widest width of the third section.

In the embodiment of the present application, a segmented or tapered second film layer 2 is provided, which facilitates the attachment and tearing of the second film layer 2, and is particularly suitable for medium and large-sized display screens.

The thickness of the second film layer 2 in the direction perpendicular to the substrate can be any appropriate value, and the embodiment of the present disclosure does not specifically limit the thickness of the second film layer 2. In an example, the thickness of the second film layer 2 in the direction perpendicular to the substrate is 0.3-0.5 mm. In an example, the thickness of the first film layer 3 in the direction perpendicular to the substrate may be less than or equal to 0.1 mm. It should be noted that the materials of the first film layer 3 and the second film layer 2 can be finished films or customized films according to requirements. Accordingly, there are two processes for thickening the first film layer 3 and the second film layer 2. One process is to reattach a thin film layer, the number of layers to be reattached can exceed 4, for example, a film with a thickness of 50 um, and 4 layers are reattached, a film with a thickness of 200 um can be obtained. The cost of this process is relatively high, but the buffer effect of the film layer can be significantly strengthened by multi-layer reattaching. Another process is to directly extrude a thick film of a required thickness, and then cut it in the form of a sheet (after the film is thickened, it cannot be transported in the form of a roll like a conventional film, generally, when the thickness exceeds 0.2 mm, it needs to be transported in the form of a sheet).

The material of the second film layer 2 may be any suitable material, and the embodiment of the present disclosure does not specifically limit the material of the second film layer 2. For example, the material of the second film layer 2 may be selected from one or more of polyethylene glycol terephthalate (PET), polyethylene (PE), thermoplastic polyurethane elastomer (also known as thermoplastic polyurethane rubber, TPU). PET has higher hardness and better stiffness than PE; PE is soft, low cost; TPU has moderate hardness and good toughness, but the cost is the highest. In specific applications, different materials can be selected according to specific needs. The foregoing is only an exemplary description. When materials are specifically selected, other polymer materials may also be selected as the second film layer 2 to realize the inventive concept provided by the embodiments of the present application.

Figure 6:
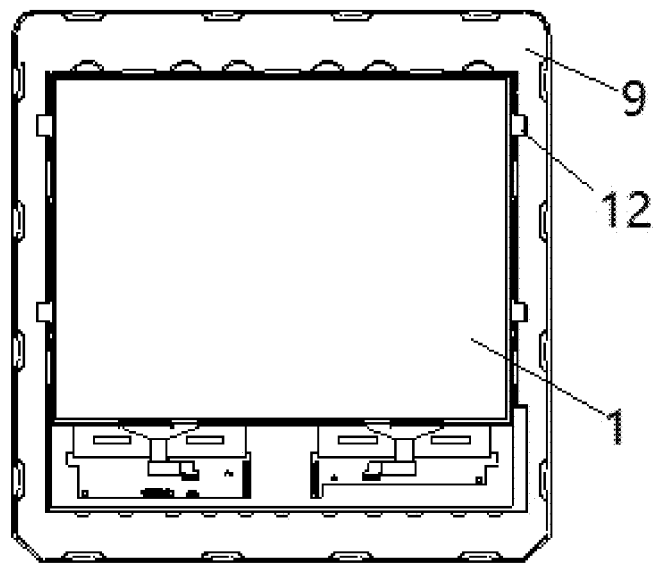
FIG. 6 illustrates a schematic diagram of a structure of a display module when placed in a tray according to an embodiment of the present disclosure.

Referring back to FIG. 2, both sides of the first film layer 3 extending in the second direction D2 may comprise first lugs 13, and both sides of the second film layer 2 extending in the second direction D2 may comprise second lugs 12. By providing the lugs, on the one hand, the tearing and adhering of the first film layer 3 and the second film layer 2 can be facilitated; on the other hand, the lugs can be symmetrically and evenly distributed so as to fit into the trays 9 used in the production line circulation process to form a limit, as illustrated in FIG. 6.

Figure 9:
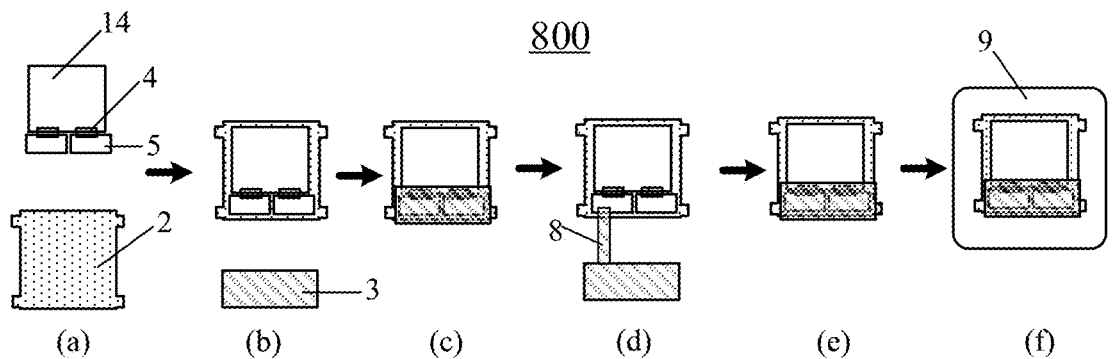
FIG. 9 illustrates a schematic diagram of a structure of a display module in different stages of the method of FIG. 8 according to an embodiment of the present disclosure.

As illustrated in FIG. 9, the first film layer 3 may also comprise a connecting strip 8 adhered to the display module 1. The connecting strip 8 can be adhered to the second film layer 2 or can be adhered to the circuit board 5. During the production process, the first film layer 3 is not always covered on the upper surfaces of the chip on film 4 and the circuit board 5. When it is necessary to process the chip on film 4 and the circuit board 5, the first film layer 3 needs to be temporarily removed from the upper surfaces of the chip on film 4 and the circuit board 5. After the processing is completed, the first film layer 3 is re-attached to the upper surfaces of the chip on film 4 and the circuit board 5. By providing the connecting strip 8 on the first film layer 3, it can be ensured that the first film layer 3 is not separated from the display module 1 when the first film layer 3 is temporarily removed from the upper surfaces of the chip on film 4 and the circuit board 5. Thereby, the loss of the first film layer 3 can be prevented, and recycling of the first film layer 3 can be realized.

Figure 7:
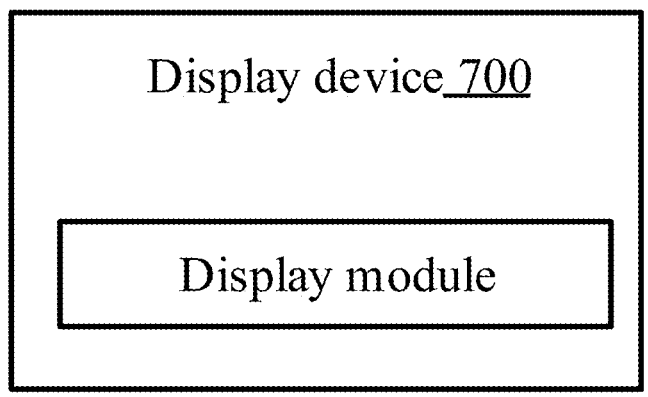
FIG. 7 illustrates a block diagram of a display device according to an embodiment of the present disclosure.

According to another aspect of the present disclosure, a display device is provided. FIG. 7 illustrates a block diagram of the display device 700, which comprises the display module 1 described in any of the previous embodiments. The display device 700 may be any suitable display device, comprising but not limited to terminal devices with a display function such as mobile phones, televisions, tablet computers, notebook computers, wearable devices, or the like.

Since the display device 700 can have substantially the same technical effects as the display module 1 described in the previous embodiments, for the sake of brevity, the technical effects of the display device 700 will not be repeated here.

Figure 8:
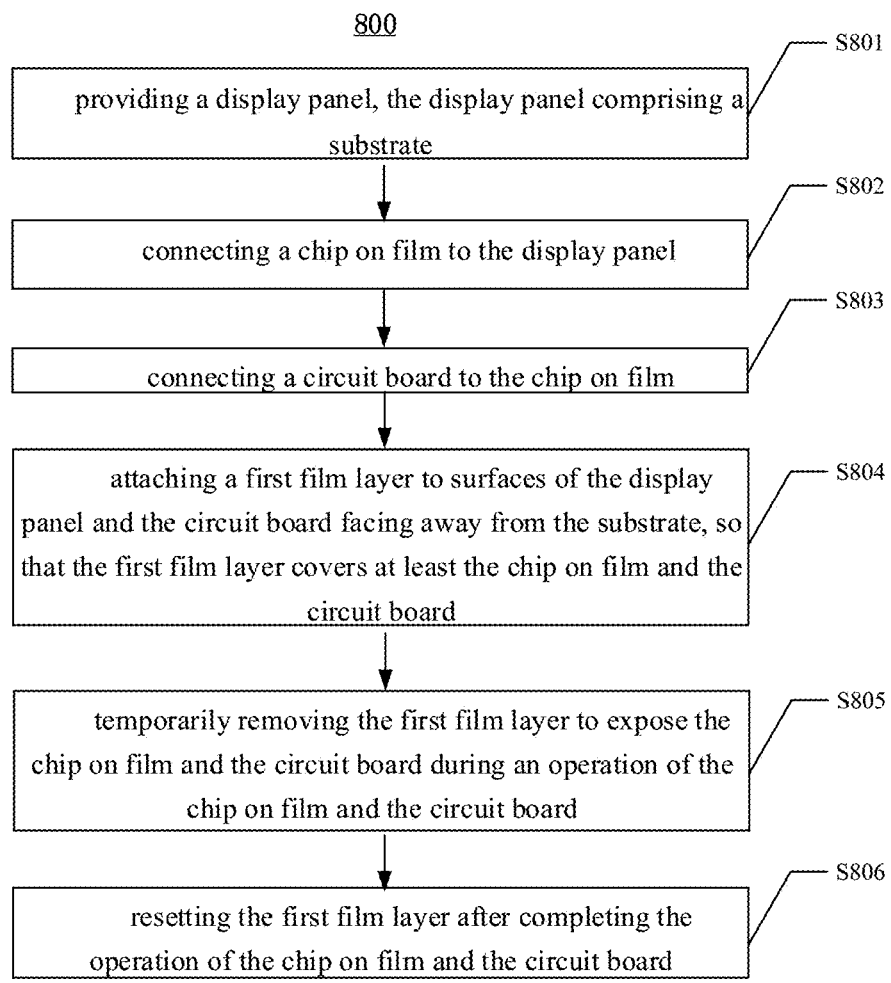
FIG. 8 illustrates a flowchart of a method for manufacturing a display module according to an embodiment of the present disclosure.

According to still another aspect of the present disclosure, a method for manufacturing a display module is provided. FIG. 8 illustrates a flowchart of a method 800 for manufacturing a display module. The method 800 is applicable to the display module 1 described in any of the previous embodiments. The steps of the method 800 are described below in conjunction with FIG. 2 and FIG. 8.

Step S801: providing a display panel 14, the display panel 14 comprising a substrate;

Step S802: connecting a chip on film 4 to the display panel 14;

Step S803: connecting a circuit board 5 to the chip on film 4;

Step S804: attaching a first film layer 3 to the surfaces of the display panel 14 and the circuit board 5 facing away from the substrate, so that the first film layer 3 covers at least the chip on film 4 and the circuit board 5;

Step S805: temporarily removing the first film layer 3 to expose the chip on film 4 and the circuit board 5 during an operation of the chip on film 4 and the circuit board 5; and Step S806: resetting the first film layer 3 after completing the operation of the chip on film 4 and the circuit board 5.

In some embodiments, before the step S804, the method 800 may further comprise the following step: attaching a second film layer 2 to the substrate of the display panel 14 so that the second film layer 2 covers the surfaces of the display panel 14, the chip on film 4, and the circuit board 5 facing away from the first film layer 3.

FIG. 9 illustrates a schematic diagram of the structure of the display module 1 in different stages of the method 800. In stage (a), providing the display panel 14, the chip on film 4 connected to the display panel 14, and the circuit board 5 connected to the chip on film 4, and attaching the second film layer 2 to the substrate of the display panel 14, the four sides of the second film layer 2 respectively extend beyond the display panel 14, the chip on film 4 and the circuit board 5. In stage (b), attaching the first film layer 3 to the surfaces of the display panel 14 and the circuit board 5 facing away from the substrate, so that the first film layer 3 covers at least the chip on film 4 and the circuit board 5. In stage (c), during the transfer of the display module in the production workshop due to the requirements of the assembly line, the first film layer 3 and the second film layer 2 are kept attached to better fix the chip on film 4 and the circuit board 5, so that the chip on film 4 can be reduced or even prevented from peeling when it is pulled or scratched by foreign objects. In stage (d), when it is necessary to process the chip on film 4 and the circuit board 5, for example, sticking the heat dissipation film, sticking the tape, connecting the patch cord, lighting test, etc., temporarily removing the first film layer 3 from the upper surfaces of the chip on film 4 and the circuit board 5 to expose the chip on film 4 and the circuit board 5. Due to the existence of the connecting strip 8, the first film layer 3 will not be separated from the display module, thereby preventing the first film layer 3 from being lost.

The lighting test refers to inputting the timing information of the display module, the gray-scale voltages of the red, green, and blue pixels, data signals and the like to the display module to check whether the display module can work normally. In stage (e), after the operation of the chip on film 4 and the circuit board 5 is completed, the first film layer 3 is reattached to the surfaces of the display panel 14 and the circuit board 5 facing away from the substrate, so that the first film layer 3 covers at least the chip on film 4 and the circuit board 5. In stage (f), the display module 1 is loaded into the tray 9 for packaging and fixing.

On the other hand, the present disclosure provides a method for preparing the first film layer 3 and the second film layer 2 of the display module 1, and the method comprises:

T1, forming a second film layer 2 with a predetermined thickness;

T2, forming a second film layer 2 with a predetermined shape and attaching it to the bottom of the display module 1, or attaching the second film layer 2 to the bottom of the display module 1 to form the second film layer 2 with a predetermined shape;

T3, forming a first film layer 3 with a predetermined thickness;

T4, forming a first film layer 3 with a predetermined shape;

T5, forming a first film layer 3 with a predetermined adhesion;

T6, attaching the first film layer 3 to the top of the display module 1;

T7, adhering the second adhesive areas 11 of the first film layer 3 beyond the chip on film 4 and the circuit board 5 to the left and right sides of the second film layer 2 beyond the chip on film 4 and the circuit board 5.

In steps T1 and T3, "forming a second film layer 2 with a predetermined thickness" and "forming a first film layer 3 with a predetermined thickness" comprise:

forming the second film layer 2 or the first film layer 3 with a predetermined thickness by a multi-layer reattaching manner; or, preparing the second film layer 2 or the first film layer 3 with a predetermined thickness by extrusion molding.

The thickness of the second film layer 2 is 0.3-0.5 mm, and the thickness of the first film layer 3 is ≤0.1 mm. The materials of the second film layer 2 and the first film layer 3 can be finished films or customized films according to requirements. Accordingly, there are two processes for thickening the first film layer 3 and the second film layer 2. One process is to reattach a thin film layer, the number of layers to be reattached can exceed 4, for example, a film with a thickness of 50 um, and 4 layers are reattached, a film with a thickness of 200 um can be obtained. The cost of this process is relatively high, but the buffer effect of the film layer can be significantly strengthened by multi-layer reattaching. Another process is to directly extrude a thick film of a required thickness, and then cut it in the form of a sheet (after the film is thickened, it cannot be transported in the form of a roll like a conventional film, generally, when the thickness exceeds 0.2 mm, it needs to be transported in the form of a sheet).

In step T2, the second film layer 2 can be attached to the display module 1, and then a specific contour can be formed by punching with a tool; or, the second film layer 2 can be first cut to form a specific contour, and then attach the second film layer 2 to the bottom of the display module 1 through an optical alignment device and a manual jig. The way of attaching can be carried out by roller rolling. The four sides of the second film layer 2 respectively extend beyond the display panel 14, the chip on film 4, and the circuit board 5 by at least 3-5 mm.

In step T4, since the openings 7 are provided on the first film layer 3, the first film layer 3 can be opened first, and then a specific contour is formed, and then attaching the first film layer 3 to the display module 1. The components on the circuit board 5 that the openings 7 can avoid comprise a capacitor, T-CON, PMIC, ELIC, etc., the key is to avoid IC and T-CON.

In step T5, "forming a first film layer 3 with a predetermined adhesion" comprises:

forming a first adhesive area 15 with a predetermined adhesion and a second adhesive area 11 with a predetermined adhesion on the first film layer 3;

forming a non-adhesive area 10 with a predetermined shape in a part of the first adhesive area 15 by applying ink.

the adhesion of the first adhesive area 15 of the first film layer 3 is 3-10 gf/inch, the adhesion of the second adhesive areas 11 is 30 gf/inch, and the non-adhesive area 10 may not have adhesion.

It should be noted that the embodiment of the present application provides a way of applying ink to make a part of the first adhesive area 15 become a non-adhesive area. The present application is not limited to this, and the non-adhesive area 10 can also be set by applying adhesive glue in sections. On the premise of not violating the idea of the present disclosure, various ways of realizing the non-adhesive area 10 all fall within the protection scope of the present application.

In step T6, attaching the first film layer 3 to the top of the display module 1 means attaching the first film layer 3 to the display panel 14 and the circuit board 5 through an optical alignment device and a bonding jig so as to cover the upper surfaces of the chip on film 4 and the circuit board 5. It should be noted that the positions of the openings 7 of the first film layer 3 should be aligned with the corresponding electrical elements on the circuit board 5.

In step T7, completing the further attaching of the second film layer 2 and the first film layer 3, adhering the second adhesive areas 11 of the first film layer 3 beyond the chip on film 4 and the circuit board 5 to the left and right sides of the second film layer 2 beyond the chip on film 4 and the circuit board 5. The adhesion of the second adhesive areas 11 is 30 gf/inch. Rolling and attaching can be completed by roller rolling and other methods.

It will be understood that, although the terms first, second, third etc. may be used herein to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed above could be termed a second element, component, region, layer or part without departing from the teachings of the present disclosure.

Spatially relative terms, such as "below", "above", "left", "right", "top", "bottom", and the like, may be used herein for ease of description to describe one element or feature's relationship with another element(s) or feature(s) as illustrated in the figures. It will be understood that the spatially relative terms are intended to encompass different orientations of a device in use or operation in addition to the orientations depicted in the figures. For example, if a device in the figures is turned over, elements described as "below", "beneath" or "under" other elements or features would then be oriented "above" the other elements or features. Thus, the exemplary terms "below" and "under" can encompass both orientations of "above" and "below". The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or there may also be one or more intervening layers.

The terminologies used herein are for the purpose of describing particular embodiments only and are not intended to be limiting of the disclosure. As used herein, the singular forms "a", "an" and "the" are intended to include the plural forms as well, unless the context clearly indicates otherwise. It will be further understood that the terms "comprise" and/or "include", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. In the description of this specification, the description with reference to the terms "one embodiment", "another embodiment", etc. means that a specific feature, structure, material, or characteristic described in conjunction with the embodiment is included in at least one embodiment of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art may combine different embodiments or examples and features of different embodiments or examples described in this specification without contradicting each other.

It will be understood that when an element or layer is referred to as being "on", "connected to", "coupled to", or "adjacent to" another element or layer, it can be directly on, connected, coupled, or adjacent to the other element or layer, or there may be intervening elements or layers. In contrast, when an element is referred to as being "directly on," "directly connected to", "directly coupled to", or "directly adjacent to" another element or layer, there are no intervening elements or layers. Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein, but are to include deviations in shapes that result, for example, from manufacturing. Accordingly, the regions illustrated in the figures are schematic in nature and their shapes are not intended to illustrate the actual shapes of the regions of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The above are only specific implementations of the present disclosure, but the protection scope of the present disclosure is not limited thereto. Any person skilled in the art can easily think of changes or substitutions within the technical scope disclosed in the present disclosure, and the changes or substitutions should be encompassed by the protection scope of the present disclosure. Therefore, the protection scope of the present disclosure should be subject to the protection scope of the claims.

The invention claimed is:

1. A display module comprising:
a display panel comprising a substrate;
a chip on film connected to the display panel;
a circuit board connected to the chip on film; and
a first film layer attached to surfaces of the display panel and the circuit board facing away from the substrate and covering at least the chip on film and the circuit board,
wherein the first film layer comprises a first adhesive area and a non-adhesive area, the first adhesive area comprises a first part and a second part extending in a first direction,
wherein the non-adhesive area is between the first part and the second part of the first adhesive area, and the non-adhesive area and an orthographic projection of the chip on film on the first film layer at least partially overlap.

2. The display module of claim 1, wherein the circuit board comprises an integrated circuit chip and a timing controller, the first film layer comprises a plurality of openings, and the plurality of openings at least expose the integrated circuit chip and the timing controller.

3. The display module of claim 1, wherein an adhesion of the first part and the second part of the first adhesive area is 3-10 gf/inch.

4. The display module of claim 1, wherein the non-adhesive area is coated with ink.

5. The display module of claim 1, wherein four sides of the first film layer respectively extend beyond the chip on film and the circuit board, and the first film layer covers a part of the substrate of the display panel.

6. The display module of claim 1, wherein a thickness of the first film layer in a direction perpendicular to the substrate is less than or equal to 0.1 mm.

7. The display module of claim 1, wherein the first film layer comprises a connecting strip adhered to the display module.

8. The display module of claim 3, further comprising a second film layer,
wherein the second film layer is attached to the substrate of the display panel, and the second film layer covers surfaces of the display panel, the chip on film, and the circuit board facing away from the first film layer.

9. A display module comprising:
a display panel comprising a substrate;
a chip on film connected to the display panel;
a circuit board connected to the chip on film; and
a first film layer attached to surfaces of the display panel and the circuit board facing away from the substrate and covering at least the chip on film and the circuit board,
wherein the first film layer comprises a first adhesive area, the first adhesive area comprises a first part and a second part extending in a first direction,
wherein the display module further comprises a second film layer, the second film layer is attached to the substrate of the display panel, and the second film layer covers surfaces of the display panel, the chip on film, and the circuit board facing away from the first film layer, wherein two opposite sides of the second film layer respectively extend beyond the chip on film and the circuit board, the two opposite sides of the second film layer extend in a second direction intersecting with the first direction, and wherein the first film layer further comprises a second adhesive area extending in the second direction and on both sides of the first adhesive area, an adhesion of the second adhesive area is greater than the adhesion of the first adhesive area, the second adhesive area extends beyond the chip on film and the circuit board, and the second adhesive area is adhered to the two opposite sides of the second film layer.

10. The display module of claim 9, wherein the adhesion of the second adhesive area is 30 gf/inch.

11. The display module of claim 8, wherein the second film layer comprises at least two sub-film layers separated from each other, and the at least two sub-film layers are both attached to the substrate of the display panel.

12. The display module of claim 8, wherein a width of the second film layer in the first direction gradually increases in a direction from the display panel to the circuit board.

13. The display module of claim 8, wherein four sides of the second film layer respectively extend beyond the display panel, the chip on film, and the circuit board by at least 3-5 mm.

14. The display module of claim 8, wherein a thickness of the second film layer in a direction perpendicular to the substrate is 0.3-0.5 mm.

15. The display module of claim 8, wherein an adhesion of the second film layer is 3-10 gf/inch.

16. A display module comprising:
a display panel comprising a substrate;
a chip on film connected to the display panel;
a circuit board connected to the chip on film; and
a first film layer attached to surfaces of the display panel and the circuit board facing away from the substrate and covering at least the chip on film and the circuit board, wherein the first film layer comprises a first adhesive area, the first adhesive area comprises a first part and a second part extending in a first direction, wherein the display module further comprises a second film layer, the second film layer is attached to the substrate of the display panel, and the second film layer covers surfaces of the display panel, the chip on film, and the circuit board facing away from the first film layer, and wherein both sides of the first film layer extending in a second direction intersecting with the first direction comprise first lugs, and both sides of the second film layer extending in the second direction comprise second lugs.

17. A display device comprising the display module of claim 1.

18. A method for manufacturing the display module according to claim 1, comprising the following steps:
providing the display panel, the display panel comprising the substrate;
connecting the chip on film to the display panel;
connecting the circuit board to the chip on film;
attaching the first film layer to surfaces of the display panel and the circuit board facing away from the substrate, so that the first film layer covers at least the chip on film and the circuit board;
temporarily removing the first film layer to expose the chip on film and the circuit board during an operation of the chip on film and the circuit board; and
resetting the first film layer after completing the operation of the chip on film and the circuit board.

19. The method of claim 18, before the step of attaching the first film layer to surfaces of the display panel and the circuit board facing away from the substrate, further comprising:
attaching a second film layer to the substrate of the display panel, so that the second film layer covers surfaces of the display panel, the chip on film, and the circuit board facing away from the first film layer.

* * * * *